(12) United States Patent
Tachibana

(10) Patent No.: US 6,270,607 B1
(45) Date of Patent: *Aug. 7, 2001

(54) METHOD OF MANUFACTURING MULTILAYER PRINTED WIRING BOARD

(75) Inventor: Masashi Tachibana, Amagasaki (JP)

(73) Assignee: Matsushita Electric Industrial Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/052,084

(22) Filed: Mar. 31, 1998

(30) Foreign Application Priority Data

Apr. 4, 1997 (JP) .................................................... 9-086387

(51) Int. Cl.$^7$ ................................. H05K 3/40; H05K 3/02
(52) U.S. Cl. ...................... 156/150; 156/252; 156/273.3; 29/846; 174/257; 174/264
(58) Field of Search .................................. 156/150, 151, 156/273.3, 275.5, 307.7, 277, 252; 29/830, 846; 174/257, 262, 264; 361/792–795; 427/96

(56) References Cited

U.S. PATENT DOCUMENTS

| 4,383,363 | * | 5/1983 | Hayakawa et al. | 29/847 |
| 4,980,270 | | 12/1990 | Inasaka | 430/312 |
| 5,314,742 | * | 5/1994 | Kirayoglu et al. | 428/901 |
| 5,473,120 | | 12/1995 | Ito et al. | 174/264 |
| 5,525,761 | * | 6/1996 | David et al. | 174/257 |
| 5,662,987 | * | 9/1997 | Mizumoto et al. | 174/264 |
| 5,699,613 | * | 12/1997 | Chong et al. | 174/264 |
| 5,716,663 | * | 2/1998 | Capote et al. | 427/96 |
| 5,733,467 | * | 3/1998 | Kawakita et al. | 216/18 |

* cited by examiner

Primary Examiner—Michael W. Ball
Assistant Examiner—Michael A. Tolin
(74) Attorney, Agent, or Firm—Parkhurst & Wendel, LLP

(57) ABSTRACT

Photosensitive resin is applied to an internal conductive pattern layer (2) as well as to an inside layer which has a hole (3a) filled with conductive paste (3b). A hole (4a) communicating to the internal conductive pattern layer (2) by exposure and development is formed. Then, metal plated film (6a) is formed on the surface of the photosensitive resin (4) including the hole (4a). Metal plated film (6a) is processed into an external conductive pattern layer (6a). This manufacturing method can increase the wiring density on the external conductive pattern layer (6), and thus a multilayer printed wiring board of increased wiring density can be obtained.

1 Claim, 3 Drawing Sheets

METHOD OF MANUFACTURING MULTILAYER PRINTED WIRING BOARD

FIELD OF THE INVENTION

The present invention relates to a multilayer printed wiring board (hereinafter referred to PWB) extensively used in various electronics products for consumer-use as well as industrial-use.

BACKGROUND OF THE INVENTION

Personal computers, word-processors, video movie cameras, portable telephones, and the like are widely used, all of which boosts the demand for the multilayer PWB. Those electronics products require a compact size, light weight, and multi-function, and thus a more capacious accommodation for wiring as well as a higher density of surface mounting is required for the multilayer PWB.

In order to satisfy this request, a multilayer PWB employing IVH (interstitial via hole) coupling method was developed. This method uses a via hole (non-through hole) to make electric contact. Typical examples of IVH coupling method are as follows: (1) a resin-made multilayer PWB in which an IVH filled with conductive paste couples all conductive pattern layers, (2) a resin-made multilayer PWB in which photosensitive resin is used as an external layer, and a metal plated IVH is used in a provided hole on the external layer so that an internal conductive pattern layer makes contact with an external conductive pattern layer. A method of manufacturing a conventional multilayer PWB is described hereafter by referring to the attached drawings.

FIGS. 2(a), 2(b) and 2(c) depict a method of manufacturing the multilayer PWB in which the IVH filled with the conductive paste couples all conductive pattern layers. First, as shown in FIG. 2(a), a hole 13c is punched on a laminated board made of aramid nonwoven fabric which is impregnated with epoxy resin. Second, the hole is filled with conductive paste 13d, whereby an insulating substrate 13b is completed. Next, copper foil for copper-clad laminate is pasted on both faces of the insulating substrate 13b, and then the copper foil is processed into an internal conductive pattern layer 13a by using a printing method or a photographic method. An inside layer 13, in which the conductive pattern layer 13a on both faces thereof is formed, is thus produced.

A copper foil 11 normally used for copper-clad laminate and a pre-preg 12 are prepared. The pre-preg 12 is made of aramid nonwoven fabric with a punched hole in which conductive paste 12b is filled. Then, as shown in FIG. 2(b), the pre-preg 12 is laminated on both sides of the inside layer 13, and the copper foil 11 is laminated on top of the pre-preg 12. Heat and press is applied to the laminated body thus produced with a heating press machine so that the resin is melted, cooled, and solidified. The copper foil 11 is processed to an external conductive pattern layer 14a through the printing method or photographic method. The multilayer PWB 14 shown in FIG. 2(c) is thus manufactured.

FIGS. 3(a), 3(b) and 3(c) depict a method of manufacturing the multilayer PWB in which the metal plated IVH is used. First, as shown in FIG. 3(a), by using the printing method or a photographic method, an inside layer 23 is produced having an internal conductive pattern layer 23a which comprises a copper foil normally used for copper-clad laminate on both sides of an insulating substrate 23b.

Then, as shown in FIG. 3(b), is a photosensitive resin film 22 is formed on both sides of the insulating substrate 23b.

Next, a hole is formed communicating to the internal conductive pattern layer 23a on the photosensitive resin film 22 by exposure and development. Further, a through hole is drilled where conductivity between the internal conductive pattern layers 23a on both sides of the inside layer 23 is required. Then, an inside wall of the through hole and non-through hole with metal. A metal plated non-through hole is plated 24a (called photo via) and a metal plated through hole 24b are thus formed.

Finally, as shown in FIG. 3(c), a copper foil 21 is provided on the surface of photosensitive resin film 22, and the copper foil 21 is processed into an external conductive pattern layer 24c. The internal conductive pattern layer 23a thus makes electrical contact with the external conductive pattern layer 24c through the photo via 24a. Therefore, not only between the internal conductive pattern layers 23a, but also between the external conductive pattern layer 24c and the internal conductive pattern layer 23a, the electrical conductivity is assured, whereby the multilayer PWB 24 is obtained.

The conventional multilayer PWB described above, however; has increased wiring density on the external conductive pattern layer for obtaining the parts more densely mounted.

In the case of using the IVH filled with conductive paste shown in FIG. 2, the smaller diameter of the hole 12a is required in order to increase the wiring density of the external conductive pattern layer of the pre-preg 12. When the diameter of the hole 12a is narrowed, the small hole must be fully filled with conductive paste in order to avoid losing conductivity. For this purpose, the viscosity of the conductive paste must be lowered by increasing a quantity of solvent to be added. However, when increasing the solvent quantity, solvent vapors due to heating in the mounting process are increased cause delamination. Because the hole 12a filled with the conductive paste is shielded, it is not possible to increase the viscosity of the conductive paste by vaporizing the solvent of the first filled conductive paste. Thus, the conductive paste of rather higher viscosity with a little solvent must be used from the first. Due to the above problem, it has been difficult to narrow the diameter of the hole 12a to less than 200 $\mu$m. In addition, due to the rather large diameter, the land formed around the hole 12a takes space, which restricts the wiring density on the external conductive pattern layer 14a from being increased.

In the case of using the photo via 24a shown in FIG. 3, since the metal plated film is used instead of the conductive paste, a photo via having a smaller hole diameter ranging 50–100 $\mu$m can be formed. However, on the multilayer PWB 24, a number of through holes must be formed where conductivity is required between the internal conductive pattern layers 23a on both sides of the inside layer 23. The numerous through holes 24b hamper the design of a desirable external conductive pattern layer 24c, and thus restrict the wiring density from being increased.

In order to make electrical contact between the internal conductive pattern layers 23a on both sides of the inside layer, the through holes may be punched beforehand on, inside layer 23. However, when applying a photosensitive resin to the inside layer, the through holes must be filled with the photosensitive resin. It is almost impossible to fill the through holes with resin, thus this solution is not practical.

SUMMARY OF THE INVENTION

The present invention aims to provide a method of manufacturing a multilayer PWB having the higher wiring density.

The method of manufacturing the multilayer PWB comprises the following steps:

(a) forming an insulating substrate which has a hole filled with conductive paste and an internal conductive pattern layer on a surface of the insulating substrate, where the internal conductive pattern layer has a conductivity to the conductive paste, (b) forming photosensitive resin film on the surface where the internal conductive pattern layer is formed, and forming a hole communicating to the internal conductive pattern layer on the photosensitive resin film, (c) forming a conductive member in the hole on the photosensitive resin film, where the conductive member has conductivity with the internal conductive pattern layer, and (d) forming an external conductive pattern layer on the photosensitive resin film, where this conductive pattern layer has conductivity with the conductive member.

According to the present invention, the conductive paste filled into the hole on the insulating substrate makes electrical contact between the internal conductive pattern layers on both sides of the inside layer, therefore, through holes are not required. In addition, the conductive member provided in the hole on the photosensitive resin film make electrical contact between the internal conductive pattern layer and the external conductive pattern layer, therefore, the diameter of the hole can be smaller than that of the conventional hole, i.e. the pre-preg hole filled with the conductive paste of the higher viscosity. As a result, a wiring density of the external conductive pattern layer can be remarkably increased, which assures the higher density of surface mounted parts.

DESCRIPTION OF THE PREFERRED EMBODIMENTS

Embodiments of the present invention are described hereinafter by referring to the attached drawings.

Embodiment 1

Figure 1A:
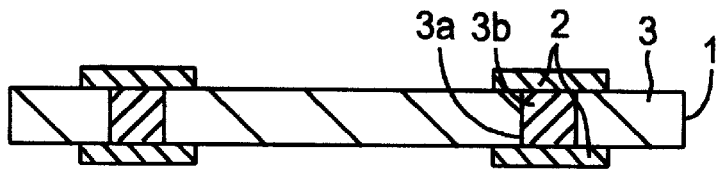
FIGS. 1(a), 1(b) and 1(c) are cross sections depicting a method of manufacturing a multilayer PWB used in Embodiment 1 of the present invention.

First, as shown in FIG. 1(a), aramid nonwoven fabric in which epoxy resin (thermosetting resin) is impregnated is laminated. Next, the epoxy resin is made semi-setting to form a through hole 3a thereon, the through hole 3a is filled with conductive paste 3b to complete an insulating substrate 3. Then, a copper foil (for copper-clad laminate) is disposed on both sides of the insulating substrate 3 to be bonded by thermo-compression. The copper foils are processed into internal conductive pattern layers 2 by the printing method or the photographic method. The inner layer 1 is thus manufactured, i.e. the conductive pattern layers 2 on both sides are connected by the conductive paste 3b.

Figure 1B:
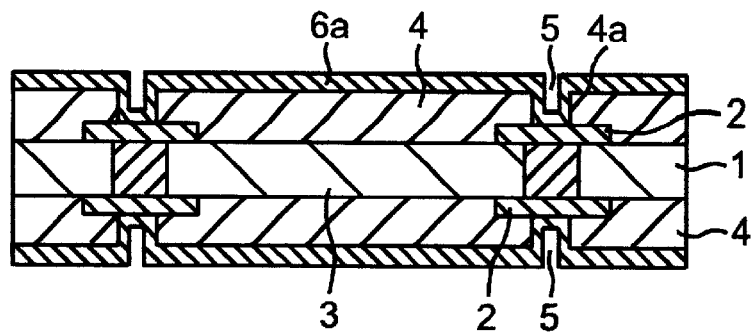

Second, as shown in FIG. 1(b), photosensitive resin is applied to both sides of the inside layer 1 to form a photosensitive resin film 4 thereon. Next, on the film 4, a hole 4a communicating to the internal conductive pattern layer 2 by exposure and development is formed. Then the surface of the photosensitive resin film 4 including the bottom and inside wall of the hole 4a is plated with metal to form metal plated film 6a.

Figure 1C:
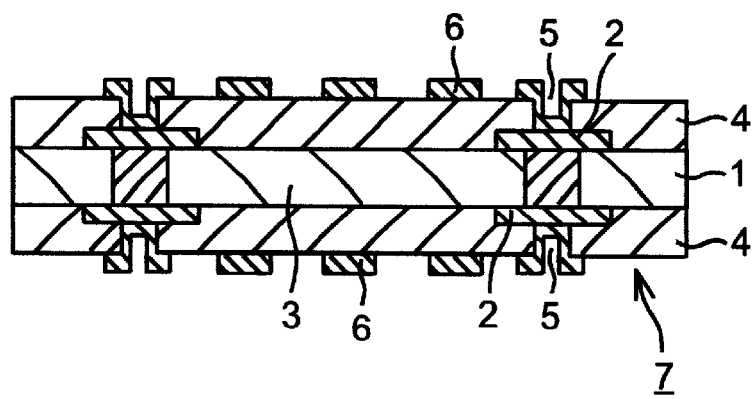

Third, as shown in FIG. 1(c), the metal plated film 6a is processed into the external conductive pattern layer 6 by the printing method or the photographic method. The metal plated hole 4a (photo via 5) thus makes contact between the internal conductive pattern layer 2 and the external conductive pattern layer 6, whereby the multilayer PWB 7 is manufactured.

Figure 2A:
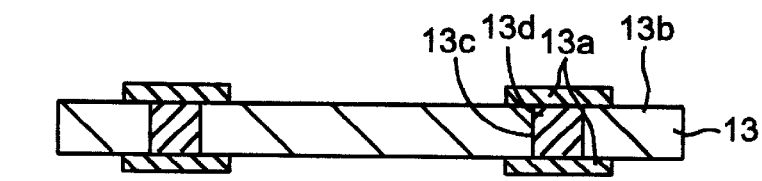
FIGS. 2(a), 2(b) and 2(c) are cross sections depicting a conventional method of manufacturing a multilayer PWB.
Figure 2B:
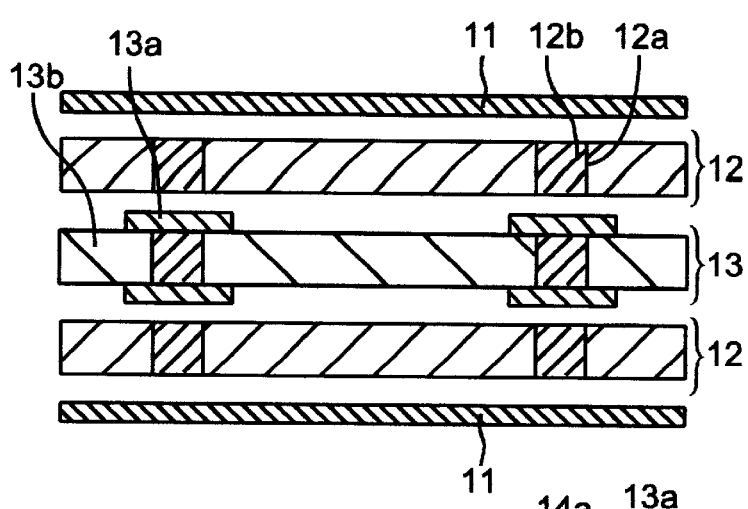
Figure 2C:
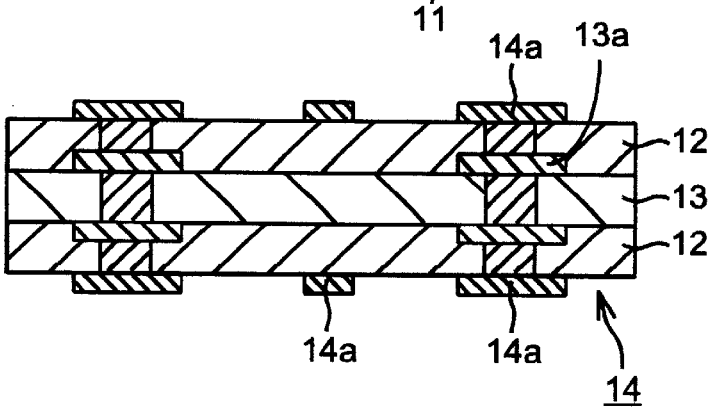
Figure 3A:
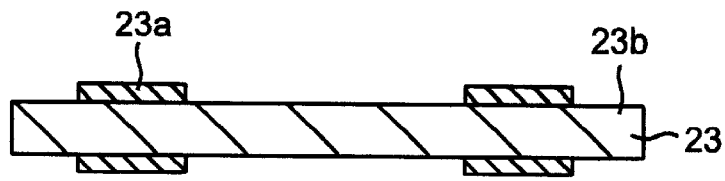
FIGS. 3(a), 3(b) and 3(c) are cross sections depicting another conventional method of manufacturing a multilayer PWB.
Figure 3B:
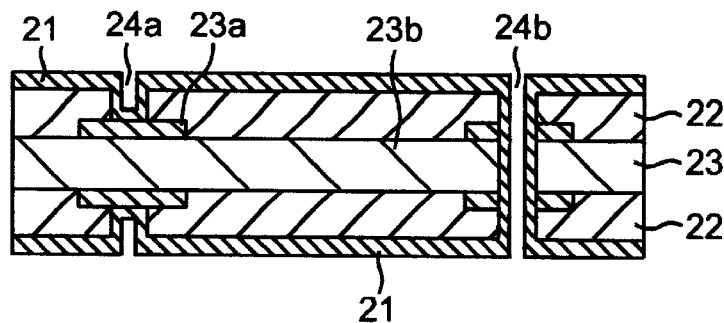
Figure 3C:
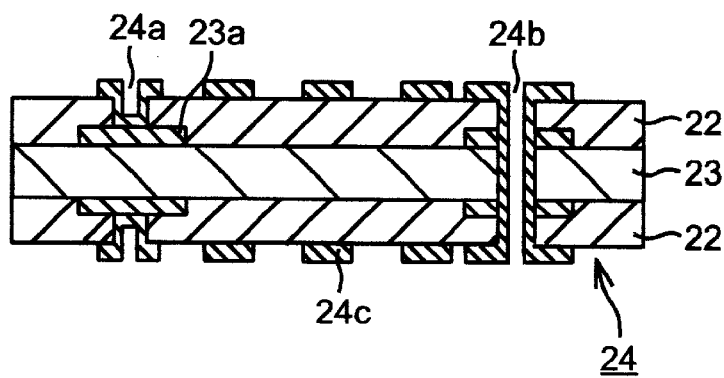

When comparing the multilayer PWB manufactured in Embodiment 1 with the conventional one shown in FIG. 2, the diameter of a land around the photo via 5 on the photosensitive resin film 4 is less than half that of the conventional one. As a result, the multilayer PWB having the higher wiring density of the external conductive pattern layer can be obtained.

When inserting a part having a lead wire beside a surface mounting chip, a hole is punched for the part, a photo via is provided and the hole is plated with metal to form a through hole. Thus, providing the through hole in addition to the photo via makes it possible to accommodate the part having a lead wire.

In Embodiment 1, the external conductive pattern layer 6 is formed by the metal plated film 6a, however; instead of the metal plated film 6a, it can be formed by a conductive foil pasted onto the photosensitive resin film 4 although an additional step of pasting the conductive foil is required.

Embodiment 2

A method of manufacturing to be described in Embodiment 2 differs from that in Embodiment 1 in the following point: before providing metal plating, another step is added, i.e. the hole 4a on the photosensitive resin film 4 is filled with conductive paste of the lower viscosity. Because the other steps are the same, detail description thereof is omitted.

The inside layer 1 is produced through the same steps of Embodiment 1, and the photosensitive resin 4 is applied thereto and the hole 4a is formed. The hole 4a is filled with the conductive paste of rather low viscosity which is adjusted appropriately by adding solvent. After reducing the solvent, the surface of the photosensitive resin film 4 is plated with metal. Finally, the metal plated film is processed into the external conductive pattern layer, as described in Embodiment 1.

In Embodiment 2, since the conductive paste of the lower viscosity is used, the smaller photo via can be filled therewith. Since the metal plated film is formed on the photosensitive resin film after filling the photo via with the conductive paste, the surface of the metal plated film can be flat. As a result, a higher density of wiring on the less uneven external conductive pattern layer can be obtained.

Embodiment 3

A method of manufacturing to be described in Embodiment 3 differs from that in Embodiment 1 in the following point: instead of providing metal plating as described in Embodiment 1, conductive paste of the lower viscosity is applied to the surface of the photosensitive resin film 4 including the hole 4a, and at the same time, the external conductive pattern layer is formed. Because the other steps are the same as Embodiment 1, the detail description thereof is omitted.

First, the inside layer 1 is produced through the same steps as defined in Embodiment 1, and apply the photosensitive resin 4 is applied on the inside layer 1 to form the hole 4a. Then, the external conductive pattern layer is printed onto the surface of the photosensitive resin film 4 by using a screen printing technique. This conductive pattern comprises conductive paste of rather low viscosity which is appropriately adjusted by adding solvent. The hole 4a is filled with this conductive paste at the same time. The amount of the solvent is then reduced.

In this case, since the conductive paste of the lower viscosity is employed, a higher wiring density can be realized. Further, because the external conductive pattern layer has undergone a screen process printing, and is formed thus directly on the photosensitive resin surface, manufacturing process can be simplified.

The present invention is not limited within the scope of the above embodiments, but it is obvious that there are various modifications. For instance, it has been described hitherto that the multilayer PWB has two internal conductive pattern layers, however; the present invention can be applicable to a case where the PWB has three internal conductive pattern layers or more. Therefore, various modifications may be made within the scope and range of equivalents of the claims and without departing from the spirit of the invention.

What is claimed is:

1. A method of manufacturing a multilayer printed wiring board, comprising:

forming a through hole in an aramid nonwoven fabric impregnated with a thermosetting resin when the impregnating thermosetting resin is in a semi-setting state;

filling the through hole with conductive paste to complete an insulating substrate;

bonding a copper foil on both sides of the insulating substrate by thermo-compression to form a copper-clad laminate;

forming an internal conductive pattern layer and an internal conductive pattern land made of only the copper foil to complete an inner circuit board, said land covering a portion of said aramid nonwoven fabric where the through hole is formed;

forming a photosensitive resin film on a surface of the inner circuit board;

forming a photo via communicating with the land or the internal conductive pattern layer in the applied photosensitive resin film by exposing and developing said film;

filling the photo via with conductive paste, the viscosity of which is adjusted by adding solvent;

reducing the solvent from the conductive paste filled in the photo via; and forming an external conductive pattern layer on the photosensitive resin film and a land just above the photo via by plating on a surface of the photosensitive resin film said surface including a portion lust above the photo via, wherein a diameter of the photo via is smaller than the diameter of the through hole, and a diameter of the land on the photo via is smaller than a diameter of the internal conductive pattern land.

* * * * *